US010283522B2

(12) United States Patent
Zushi et al.

(10) Patent No.: US 10,283,522 B2
(45) Date of Patent: May 7, 2019

(54) THREE DIMENSIONAL SEMICONDUCTOR MEMORY DEVICE IN WHICH A CHANNEL LAYER HAS A STACKED STRUCTURE INCLUDING AN OUTER SEMICONDUCTOR LAYER AND A DOPED INNER SEMICONDUCTOR LAYER

(71) Applicant: Toshiba Memory Corporation, Minato-ku (JP)

(72) Inventors: Tomofumi Zushi, Yokkaichi (JP); Shinya Naito, Toyota (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/696,372

(22) Filed: Sep. 6, 2017

(65) Prior Publication Data

US 2018/0277560 A1    Sep. 27, 2018

(30) Foreign Application Priority Data

Mar. 21, 2017    (JP) ................................. 2017-054765

(51) Int. Cl.
| | |
|---|---|
| *H01L 27/11582* | (2017.01) |
| *H01L 29/10* | (2006.01) |
| *H01L 29/06* | (2006.01) |
| *H01L 21/28* | (2006.01) |
| *H01L 27/11565* | (2017.01) |

(52) U.S. Cl.
CPC .. *H01L 27/11582* (2013.01); *H01L 21/28282* (2013.01); *H01L 29/0649* (2013.01); *H01L 29/1033* (2013.01); *H01L 27/11565* (2013.01); *H01L 29/1041* (2013.01)

(58) Field of Classification Search
None
See application file for complete search history.

(56) References Cited

U.S. PATENT DOCUMENTS

| | | | |
|---|---|---|---|
| 7,956,408 | B2 | 6/2011 | Enda et al. |
| 9,209,199 | B2 | 12/2015 | Simsek-Ege et al. |
| 9,559,115 | B2 | 1/2017 | Sim et al. |
| 2011/0215394 | A1* | 9/2011 | Komori ............ H01L 27/11573 257/324 |

(Continued)

FOREIGN PATENT DOCUMENTS

JP    2015-050466    3/2015

*Primary Examiner* — Bilkis Jahan
(74) *Attorney, Agent, or Firm* — Oblon, McClelland, Maier & Neustadt, L.L.P.

(57) ABSTRACT

According to an embodiment, a semiconductor memory device includes a stacked body in which insulating layers and electrode films are alternately stacked, a pillar member arranged in a memory hole that is disposed in the stacked body in a thickness direction, and a semiconductor layer provided below the pillar member. The pillar member has a structure in which a memory film and a channel layer are stacked in order from a side of the stacked body. The channel layer has a stacked structure that includes an outer channel semiconductor layer, an intermediate layer made of an insulating material, and an inner channel semiconductor layer, from a side of the memory film. Both of the outer channel semiconductor layer and the inner channel semiconductor layer are electrically connected to the semiconductor layer.

12 Claims, 19 Drawing Sheets

(56) References Cited

U.S. PATENT DOCUMENTS

| | | | |
|---|---|---|---|
| 2012/0299005 A1* | 11/2012 | Lee | H01L 27/11582 |
| | | | 257/66 |
| 2015/0060992 A1 | 3/2015 | Taekyung et al. | |
| 2015/0115347 A1* | 4/2015 | Mun | H01L 29/792 |
| | | | 257/324 |
| 2016/0268379 A1 | 9/2016 | Yamasaki et al. | |

\* cited by examiner

THREE DIMENSIONAL SEMICONDUCTOR MEMORY DEVICE IN WHICH A CHANNEL LAYER HAS A STACKED STRUCTURE INCLUDING AN OUTER SEMICONDUCTOR LAYER AND A DOPED INNER SEMICONDUCTOR LAYER

CROSS-REFERENCE TO RELATED APPLICATIONS

This application is based upon and claims the benefit of priority from Japanese Patent Application No. 2017-54765, filed on Mar. 21, 2017; the entire contents of which are incorporated herein by reference.

FIELD

Embodiments described herein relate generally to a semiconductor memory device and a manufacturing method of a semiconductor memory device.

BACKGROUND

In recent years, with the advancement in scaling of semiconductor memory devices, a three-dimensional non-volatile memory has been proposed which includes memory cells forming a stacked structure. In the three-dimensional nonvolatile memory, structure bodies are arranged in a two-dimensional state on a silicon layer, where each structure body includes a plurality of memory cells stacked in a height direction along the side surface of a pillar-shaped channel semiconductor film that extends in the height direction.

Further, because the three-dimensional nonvolatile memory is required to increase its capacity, the number of stacked layers of memory cells is being increased. As the number of staked layers of memory cells is increased, the channel resistance of the memory cell array becomes larger, and the current flowing through the channel for sensing the state stored in the memory cells ends up being reduced.

DETAILED DESCRIPTION

In general, according to one embodiment, a semiconductor memory device includes a stacked body in which insulating layers and electrode films are alternately stacked, a pillar member arranged in a memory hole that is disposed in the stacked body in a thickness direction, and a semiconductor layer provided below the pillar member. The pillar member has a structure in which a memory film and a channel layer are stacked in order from a side of the stacked body. The channel layer has a stacked structure that includes an outer channel semiconductor layer, an intermediate layer made of an insulating material, and an inner channel semiconductor layer, from a side of the memory film. Both of the outer channel semiconductor layer and the inner channel semiconductor layer are electrically connected to the semiconductor layer.

Exemplary embodiments of a semiconductor memory device and a manufacturing method of a semiconductor memory device will be explained below in detail with reference to the accompanying drawings. The present invention is not limited to the following embodiments. The sectional views of a semiconductor memory device used in the following embodiments are schematic, and so the relationship between the thickness and width of each layer and/or the thickness ratios between respective layers may be different from actual states. Further, the film thicknesses shown hereinafter are mere examples, and they are not limiting.

First Embodiment

Figure 1:
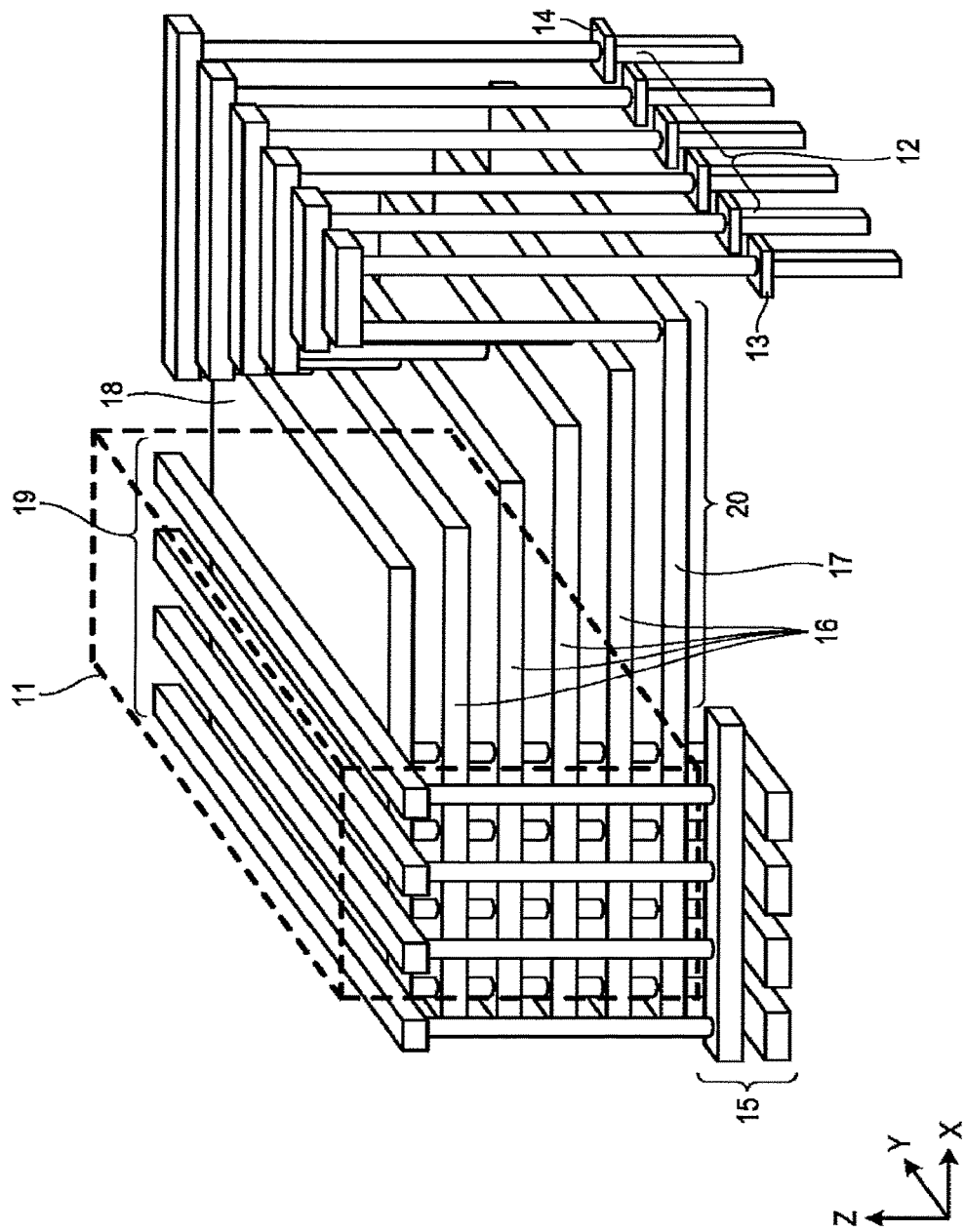
FIG. 1 is a perspective view schematically illustrating a structural example of a semiconductor memory device.

FIG. 1 is a perspective view schematically illustrating a structural example of a semiconductor memory device. The semiconductor memory device includes a memory cell part 11, a word line drive circuit 12, a source-side selection gate line drive circuit 13, a drain-side selection gate line drive circuit 14, a sense amplifier 15, word lines 16, a source-side selection gate line 17, a drain-side selection gate line 18, and bit lines 19. Hereinafter, the extending direction of the bit lines 19 will be referred to as "Y-direction", the stacked direction of memory cell transistors will be referred to as "Z-direction", and a direction perpendicular to the Y-direction and the Z-direction will be referred to as "X-direction".

The memory cell part 11 has a configuration in which a plurality of memory strings are arranged above a substrate, where each memory string includes a memory cell column composed of one or more memory cell transistors (each of which will also be simply referred to as "memory cell", hereinafter) arrayed in the Z-direction, together with a drain-side selection transistor and a source-side selection transistor respectively provided at the upper and lower ends of the memory cell column. As described later, each of the memory cell transistors, the drain-side selection transistor, and the source-side selection transistor has a structure in which a gate electrode is formed on the side surface of a hollow columnar structure body including a semiconductor film, a tunnel insulating film, a charge accumulation film, and a block insulating film stacked in this order. In each memory cell transistor, the gate electrode serves as a control gate electrode, and, in each of the drain-side selection transistor and the source-side selection transistor, the gate electrode serves as a selection gate electrode. The example illustrated here is a case where one memory string is provided with memory cells in four layers.

Each word line 16 connects the control gate electrodes of memory cells at the same height to each other among memory strings present within a predetermined rang. Further, the source-side selection gate line 17 connects the selection gate electrodes of source-side selection transistors to each other among the memory strings present within the predetermined range. The drain-side selection gate line 18 connects the selection gate electrodes of drain-side selection transistors to each other among the memory strings present within the predetermined range. Further, the bit lines 19 are arranged such that they are connected to the upper sides of the respective memory strings in a direction intersecting with the X-direction (here, in the Y-direction perpendicular to the X-direction).

The word line drive circuit 12 is a circuit for controlling voltage to be applied to the word lines 16. The source-side selection gate line drive circuit 13 is a circuit for controlling voltage to be applied to the source-side selection gate line 17. The drain-side selection gate line drive circuit 14 is a circuit for controlling voltage to be applied to the drain-side selection gate line 18. Further, the sense amplifier 15 is a circuit for amplifying an electric potential read from a selected memory cell. Here, in the following description, when there is no need to distinguish the source-side selection gate line 17 and the drain-side selection gate line 18 from each other, they will be simply referred to as "selection gate line". Further, when there is no need to distinguish the source-side selection transistor and the drain-side selection transistor from each other, they will be simply referred to as "selection transistor".

The word lines 16 and the selection gate lines 17 and 18 of the memory cell part 11 are connected to the word line drive circuit 12, the source-side selection gate line drive circuit 13, and the drain-side selection gate line drive circuit 14, through respective contacts in a word line contact part 20 (electrode line contact part) adjacent to the memory cell part 11. The word line contact part 20 is arranged on that side of the memory cell part 11 which faces the word line drive circuit 12, and is structured such that the word lines 16 and the selection gate lines 17 and 18, which are connected to the memory cells and the selection transistors present at respective heights, have been processed in a stepwise state.

Figure 2:
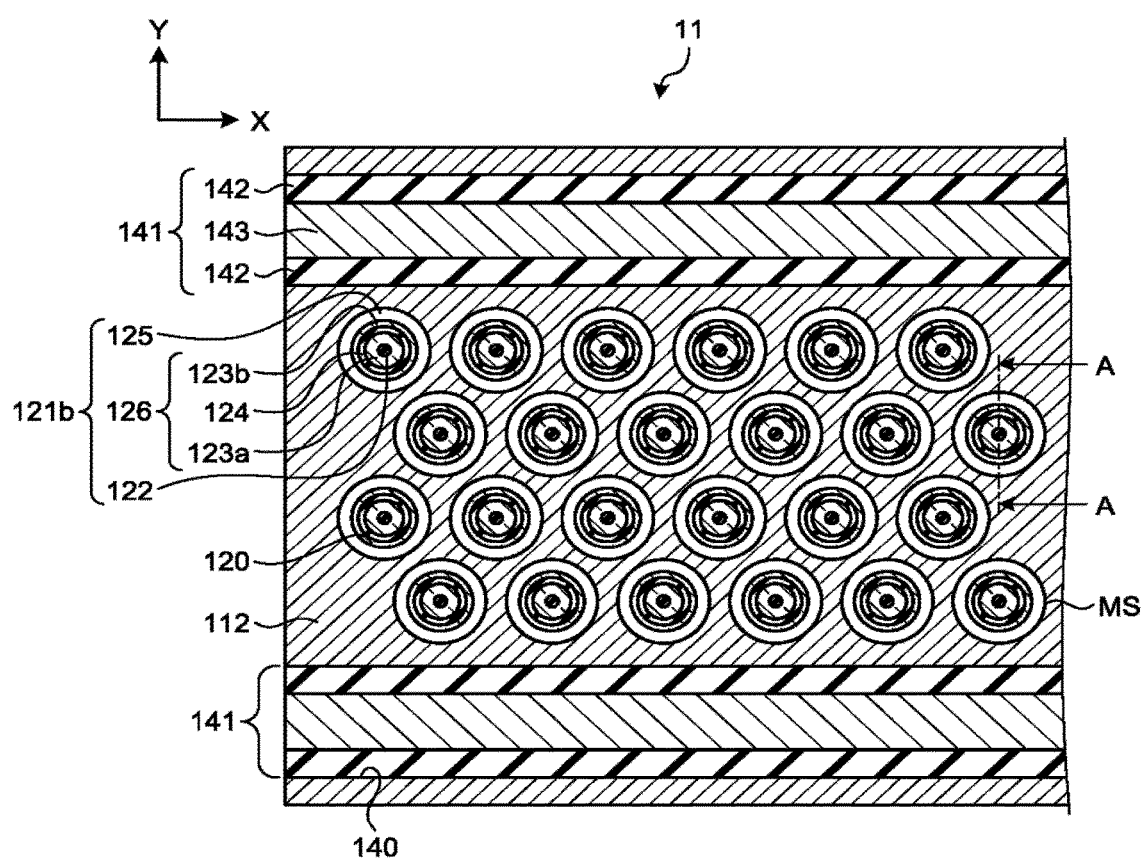
FIG. 2 is a sectional view schematically illustrating a configuration example, in a direction perpendicular to a Z-direction, of a memory cell part in a semiconductor memory device according to a first embodiment.
Figure 3:
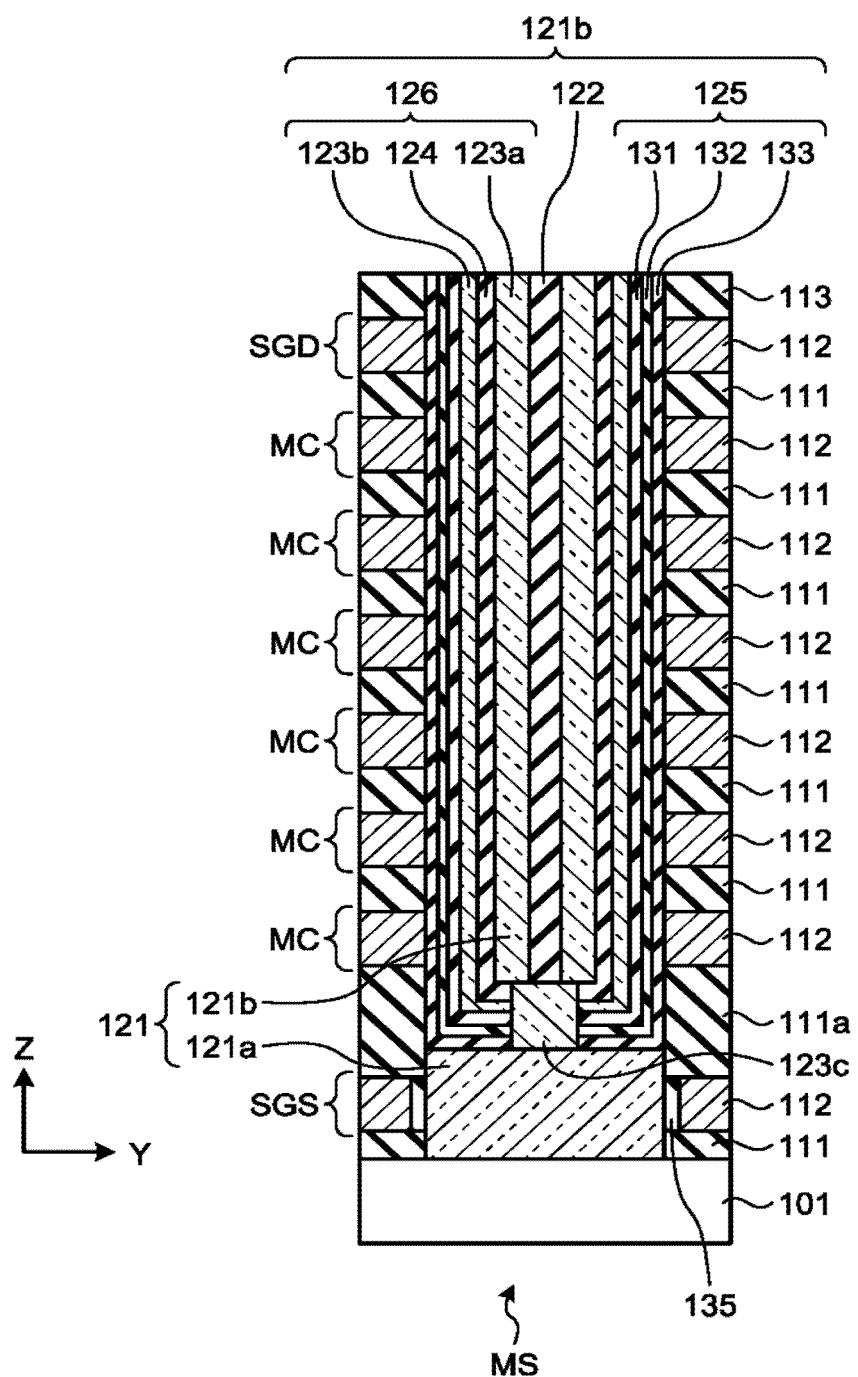
FIG. 3 is a sectional view schematically illustrating a configuration example, in a direction perpendicular to an X-direction, of the memory cell part in the semiconductor memory device according to the first embodiment.

FIG. 2 is a sectional view schematically illustrating a configuration example, in a direction perpendicular to the Z-direction, of the memory cell part in a semiconductor memory device according to a first embodiment. FIG. 3 is a sectional view schematically illustrating a configuration example, in a direction perpendicular to the X-direction, of the memory cell part in the semiconductor memory device according to the first embodiment. Here, FIG. 2 is a view illustrating a portion cut by a plane parallel with the substrate surface, at the position of the drain-side selection transistor, and seen from the upper side. Further, FIG. 3 corresponds to a sectional view taken along a line A-A of FIG. 2.

In the memory cell part 11, as illustrated in FIGS. 2 and 3, memory strings MS are arranged almost vertically and in a two-dimensional state on a semiconductor layer 101. The semiconductor layer 101 may be a semiconductor substrate, or may be a semiconductor film provided above a semiconductor substrate. The semiconductor layer 101 is preferably a single crystalline semiconductor substrate or single crystalline semiconductor layer. Each memory string MS has a configuration in which a plurality of transistors are connected in series. Each memory string MS includes a pillar member 121 and electrode films 112.

The pillar member 121 includes a lower pillar member 121a and an upper pillar member 121b. The lower pillar member 121a is formed of a semiconductor layer for providing the channel of a transistor arranged at the lowermost layer of the memory string MS. The lower pillar member 121a is provided on the semiconductor layer 101, and is made of, for example, epitaxial silicon.

The upper pillar member 121b is provided above the lower pillar member 121a. The upper pillar member 121b has a structure which includes a pillar-shaped core insulating layer 122, and a channel layer 126 and a multi-layer film 125 stacked in this order on the outer peripheral surface of the pillar-shaped core insulating layer 122. The multi-layer film 125 is provided to serve as a memory film of each memory cell. Thus, each of the channel layer 126 and the multi-layer film 125 has a hollow pillar shape.

Further, as illustrated in FIGS. 2 and 3, in this embodiment, the channel layer 126 has a structure in which an inner channel semiconductor layer 123a, an interlayer film 124, and an outer channel semiconductor layer 123b are stacked in this order from the core insulating layer 122 side. Thus, the channel layer 126 has a double channel structure in which its channel is divided into two parts by the hollow pillar-shaped interlayer film 124 extending in the Z-direction. By adopting this double channel structure, it is possible to increase an ON current of the memory cells, as compared with a case using a single channel structure.

The core insulating layer 122 is made of, for example, an insulating material, such as silicon oxide ($SiO_2$). The inner channel semiconductor layer 123a and the outer channel semiconductor layer 123b are provided to serve as the channels of the transistors composing the memory string MS, and are made of, for example, a semiconductor material, such as poly-silicon (Poly-Si). The interlayer film 124, as an intermediate layer between the inner channel semiconductor layer 123a and the outer channel semiconductor layer 123b, is made of, for example, an insulating material, such as silicon oxide.

The multi-layer film 125 provided as the memory film includes a tunnel insulating film 131, a charge accumulation film 132, and a block insulating film 133 stacked from the channel layer 126 side toward the electrode films 112. The tunnel insulating film 131 is made of, for example, an insulating material, such as silicon oxide. The charge accumulation film 132 is made of, for example, a material that enables charge accumulation, such as silicon nitride (SiN). The block insulating film 133 is formed of a single layer film or film stack, which is made of, for example, an insulating material or insulating materials, such as silicon oxide, aluminum oxide ($Al_2O_3$), zirconium oxide ($ZrO_2$) and/or hafnium oxide (HfOx). Here, the block insulating film 133 may be formed in a shape that at least partly surrounds the upper surface, lower surface, and side surface of each of the electrode films 112, instead of being formed in the hollow pillar shape as part of the multi-layer film 125.

The inner channel semiconductor layer 123a, the interlayer film 124, the outer channel semiconductor layer 123b, and the multi-layer film 125 are formed along the side surface and bottom surface defining a space in which the upper pillar member 121b is formed. Specifically, these films are formed in a conformal state, along the side surface of each memory hole 120 formed in a stacked body composed of spacer films 111 and 111a, electrode films 112, and an insulating film 113, and along the upper surface of the lower pillar member 121a formed in the memory hole 120. The inner channel semiconductor layer 123a, the interlayer film 124, the outer channel semiconductor layer 123b, and the multi-layer film 125 are divided at the bottom, and a lower channel semiconductor layer 123c is provided to fill this dividing portion. The lower channel semiconductor layer 123c electrically connects the inner channel semiconductor layer 123a and outer channel semiconductor layer 123b of the upper pillar member 121b to the lower pillar member 121a.

The electrode films 112 are arranged in a plural number in the height direction (Z-direction) of the pillar member 121. Here, a gate insulating film 135 is provided between one of the electrode films 112 arranged as the lowermost layer in the Z-direction and the lower pillar member 121a. The electrode films 112 are made of, for example, a metal material, such as tungsten (W). Each of the spacer films 111 and 111a is arranged between electrode films 112 adjacent to each other in the Z-direction. Each of the spacer films 111 and 111a serves as an insulating layer for electrical isolation between electrode films 112 adjacent to each other in the Z-direction. As the spacer films 111 and 111a, for example, a silicon oxide film or the like is used. Alternatively, a gap may be formed as an insulating layer between electrode films 112 adjacent to each other in the Z-direction to achieve electrical isolation between the electrode films 112 adjacent to each other in the Z-direction.

As illustrated in FIG. 3, the thickness of the spacer film 111a, which is provided between the lowermost one of the electrode films 112 and the second-lowermost one of the electrode films 112, is larger than the thickness of the other spacer films 111. The boundary between the lower pillar member 121a and the upper pillar member 121b is formed to correspond to the region where the spacer film 111a is arranged. The inner channel semiconductor layer 123a, the interlayer film 124, the outer channel semiconductor layer 123b, and the multi-layer film 125 include portions stacked on the lower pillar member 121a in parallel with the upper surface of the lower pillar member 121a. In order to avoid that the portions of the inner channel semiconductor layer 123a, interlayer film 124, outer channel semiconductor layer 123b, and multi-layer film 125 present in parallel with the upper surface of the lower pillar member 121a are arranged at the position of the second-lowermost one of the electrode films 112, the thickness of the spacer film 111a is set larger than the thickness of the other spacer films 111.

In the column of the transistors connected in series in the Z-direction, the transistors at the upper and lower ends serve as selection transistors SGS and SGD. In the example illustrated in FIG. 3, the source-side selection transistor SGS is arranged on the lower side, and the drain-side selection transistor SGD is arranged on the upper side. Between these two selection transistors SGS and SGD, one or more memory cells MC are arranged at predetermined intervals. In this example, the drain-side selection transistor SGD has the same structure as the structure of the memory cells MC. Further, the source-side selection transistor SGS has a structure in which the lower pillar member 121a formed of an epitaxial silicon film serves as a channel, and an electrode film 112 arranged on the sidewall of this channel through the gate insulating film 135 serves as a gate electrode.

Here, in the above description, the upper pillar member 121b is illustrated as having a structure including the core insulating layer 122, but the upper pillar member 121b may have a structure excluding the core insulating layer 122. In this case, the inner channel semiconductor layer 123a comes to have a columnar structure.

Next, an explanation will be given of a manufacturing method of a semiconductor memory device having the configuration described above. FIGS. 4A to 4J are sectional views schematically illustrating an example of the process sequence of a manufacturing method of the semiconductor memory device according to the first embodiment.

First, a stacked body is formed on a semiconductor layer 101 by alternately stacking a spacer film 111 and a sacrificial film 151 as a predetermined number of layers, and further stacking an insulating film 113 at the uppermost position. Here, the thickness of the second-lowermost spacer film 111a is set larger than that of the other spacer films 111. As the semiconductor layer 101, for example, a single crystalline silicon film may be used. As the spacer films 111 and 111a, for example, a silicon oxide film may be used. As the insulating film 113, the same material as the spacer film 111 may be used, and, for example, a silicon oxide film may be used. The sacrificial film 151 is arranged at the position for forming each electrode film 112, and will be removed in a step to be performed later. Accordingly, the sacrificial film 151 is preferably made of a material that provides a selective ratio relative to the spacer films 111 and 111a and the insulating film 113 when an etching process is performed. As the sacrificial film 151, for example, a silicon nitride film may be used. The thickness of the spacer film 111 is, for example, 46 nm, the thickness of the spacer film 111a is, for example, 100 nm, and the thickness of the sacrificial film 151 is, for example, 46 nm.

Figure 4A:
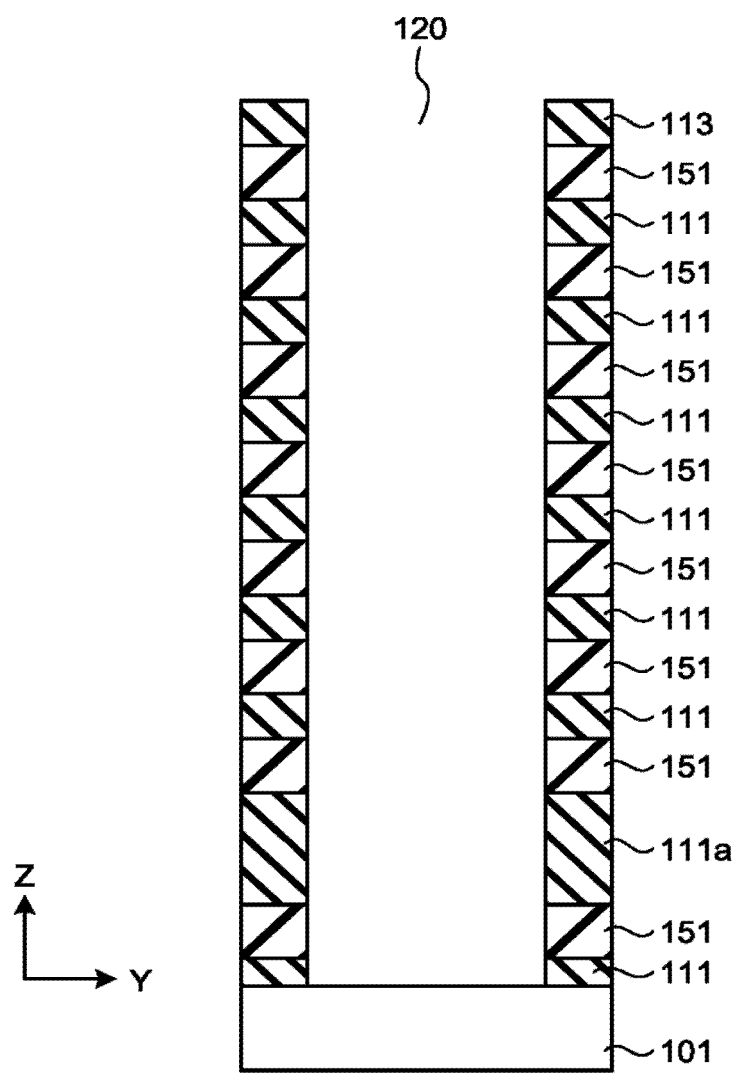
FIGS. 4A to 4J are sectional views schematically illustrating an example of the process sequence of a manufacturing method of the semiconductor memory device according to the first embodiment.

Then, a resist is applied onto the entire surface of the stacked body, and a resist pattern including opening patterns at the positions for forming pillar members 121 is formed by using a lithography technique and a development technique. Thereafter, as illustrated in FIG. 4A, memory holes 120 are formed by using an anisotropic etching technique, such as an RIE, (Reactive Ion Etching) method, through the resist pattern (not shown) serving as a mask. Each memory hole 120 is formed to penetrate the stacked body in the thickness direction. Further, the bottom of the memory hole 120 reaches down to the semiconductor layer 101.

Figure 4B:
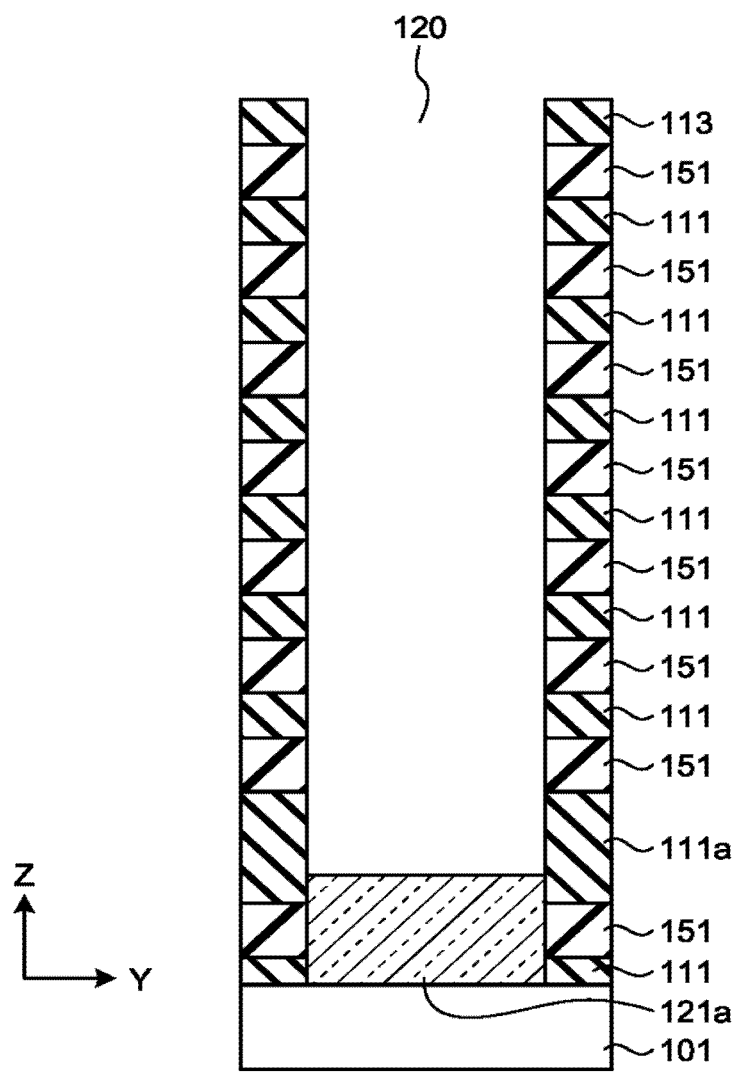

Thereafter, as illustrated in FIG. 4B, a single crystalline silicon layer is formed by using selective epitaxial growth on the semiconductor layer 101 that is made of single crystalline silicon and exposed at the bottom of each memory hole 120. This silicon layer is to be used as a lower pillar member 121a. At this time, the growth time is adjusted such that the upper surface of the lower pillar member 121a is positioned within the thickness area of the spacer film 111a.

Figure 4C:
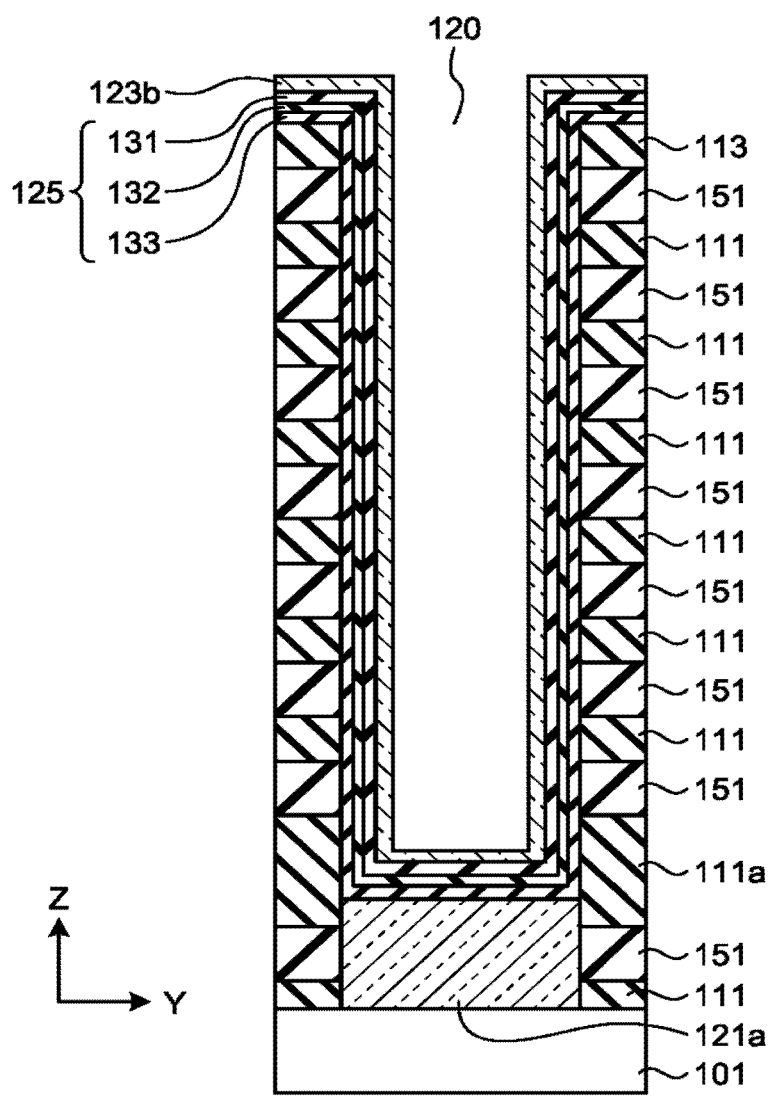

Then, as illustrated in FIG. 4C, a multi-layer film 125 is formed to cover the upper surface of the insulating film 113 and the inner surface of each memory hole 120. The multi-layer film 125 is composed of a block insulating film 133, a charge accumulation film 132, and a tunnel insulating film 131 stacked in this order from the stacked body side. As the block insulating film 133, for example, a silicon oxide film is used. As the charge accumulation film 132, for example, a silicon nitride film to used. As the tunnel insulating film 131, for example, a silicon oxide film is used.

Further, an outer channel semiconductor layer 123b is formed on the multi-layer film 125. The outer channel semiconductor layer 123b is also formed to cover the inner surface of each memory hole 120. As the outer channel semiconductor layer 123b, for example, a poly-silicon film is used.

Figure 4D:
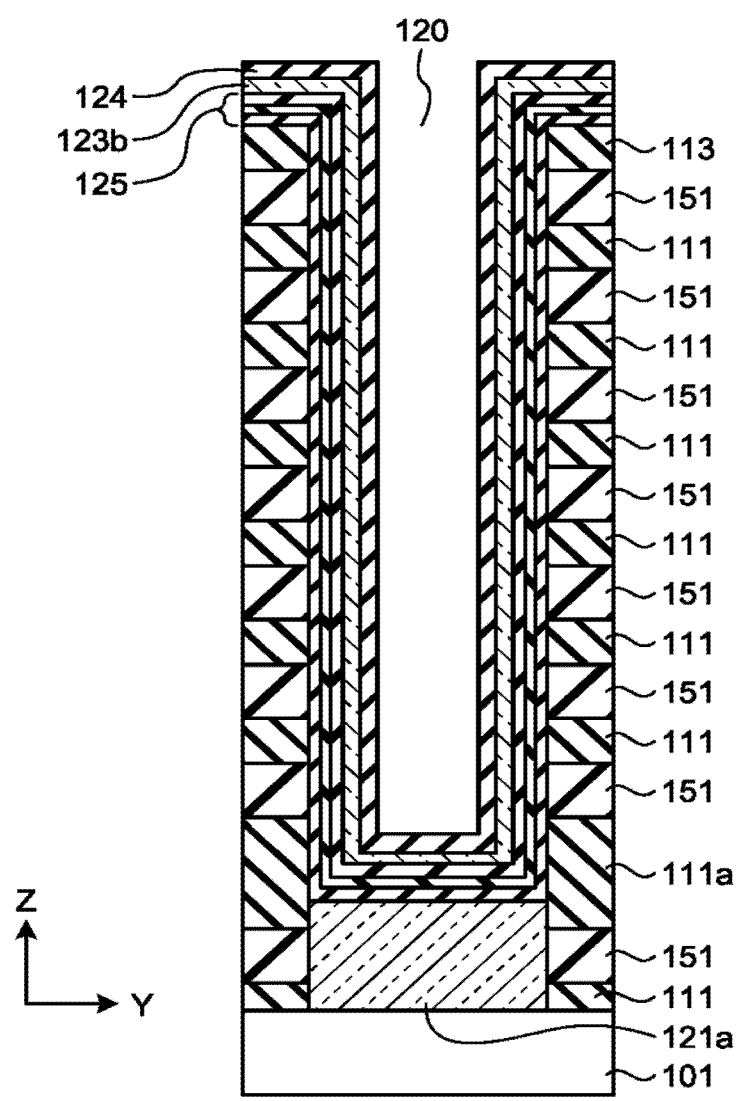

Further, as illustrated in FIG. 4D, an interlayer film 124 is formed on the outer channel semiconductor layer 123b. The interlayer film 124 is also formed to cover the inner surface of each memory hole 120. As the interlayer film 124, for example, a silicon oxide film is used.

Figure 4E:
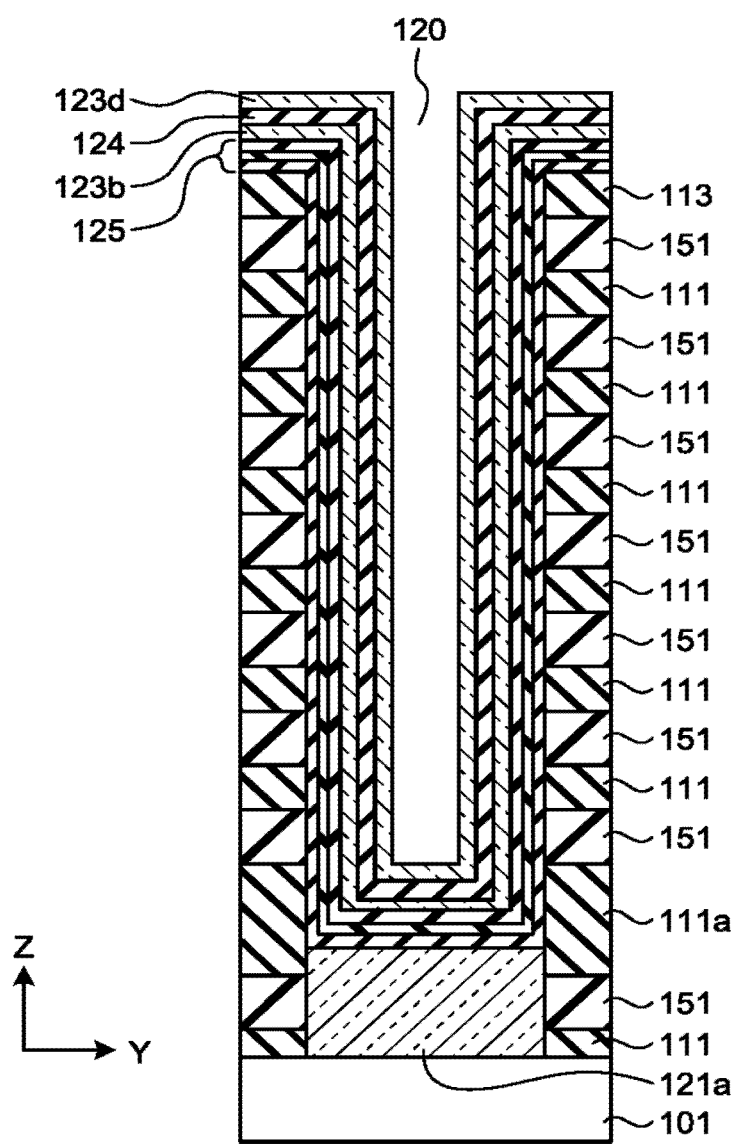

Further, as illustrated in FIG. 4E, an inner channel semiconductor layer 123d is formed on the interlayer film 124. The inner channel semiconductor layer 123d is also formed to cover the inner surface of each memory hole 120. As the inner channel semiconductor layer 123d, for example, a poly-silicon film is used.

Figure 4F:
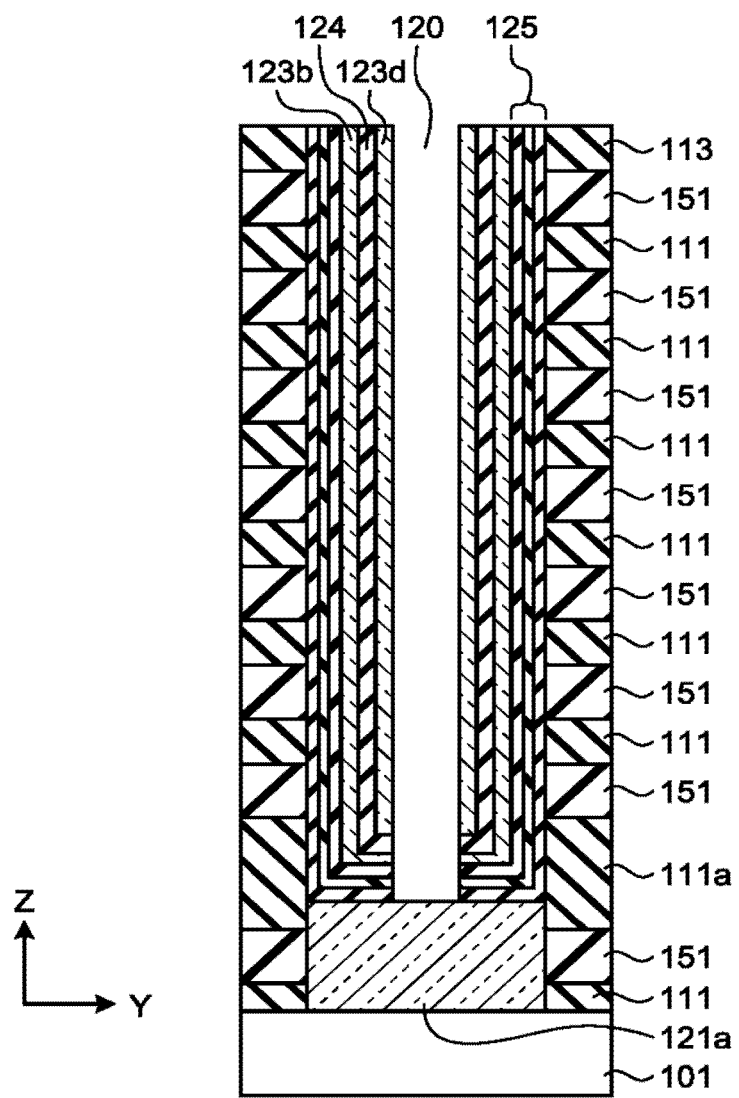

Thereafter, the inner channel semiconductor layer 123d, the interlayer film 124, the outer channel semiconductor layer 123b, and the multi-layer film 125 are etched back at their portions present on the insulating film 113 and the bottom of each memory hole 120, by using anisotropic etching, such as an RIE method. Consequently, as illustrated in FIG. 4F, the upper surface of the lower pillar member 121a is exposed at the bottom of each memory hole 120, and a film stack composed of the multi-layer film 125, the outer channel semiconductor layer 123b, the interlayer film 124, and the inner channel semiconductor layer 123d is formed on the side surface of each memory hole 120.

Figure 4G:
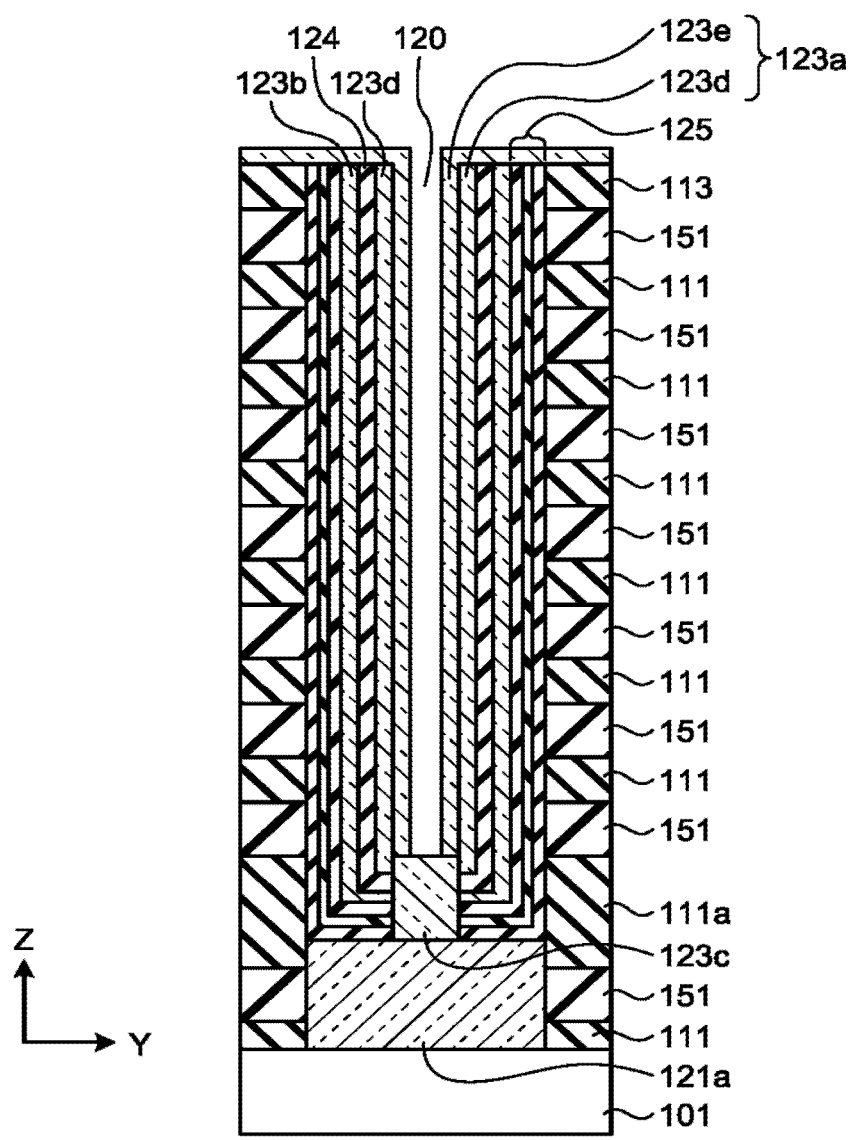

Then, as illustrated in FIG. 4G, an inner channel semiconductor layer 123e is formed on the upper surface of the insulating film 113 and the inner surface of each memory hole 120. The inner channel semiconductor layer 123e is formed also on the lower pillar member 121a exposed at the bottom of each memory hole 120. As the inner channel semiconductor layer 123e, a poly-silicon film is used. The portion of the inner channel semiconductor layer 123e deposited on the part from the upper surface of the lower pillar member 121a to the inner channel semiconductor layer 123d at the bottom of each memory hole 120 is to be used as a lower channel semiconductor layer 123c. Further, the combination of the inner channel semiconductor layer 123d and the inner channel semiconductor layer 123e, formed on the side surface of each memory hole 120, will be referred to as "inner channel semiconductor layer 123a", hereinafter.

Figure 4H:
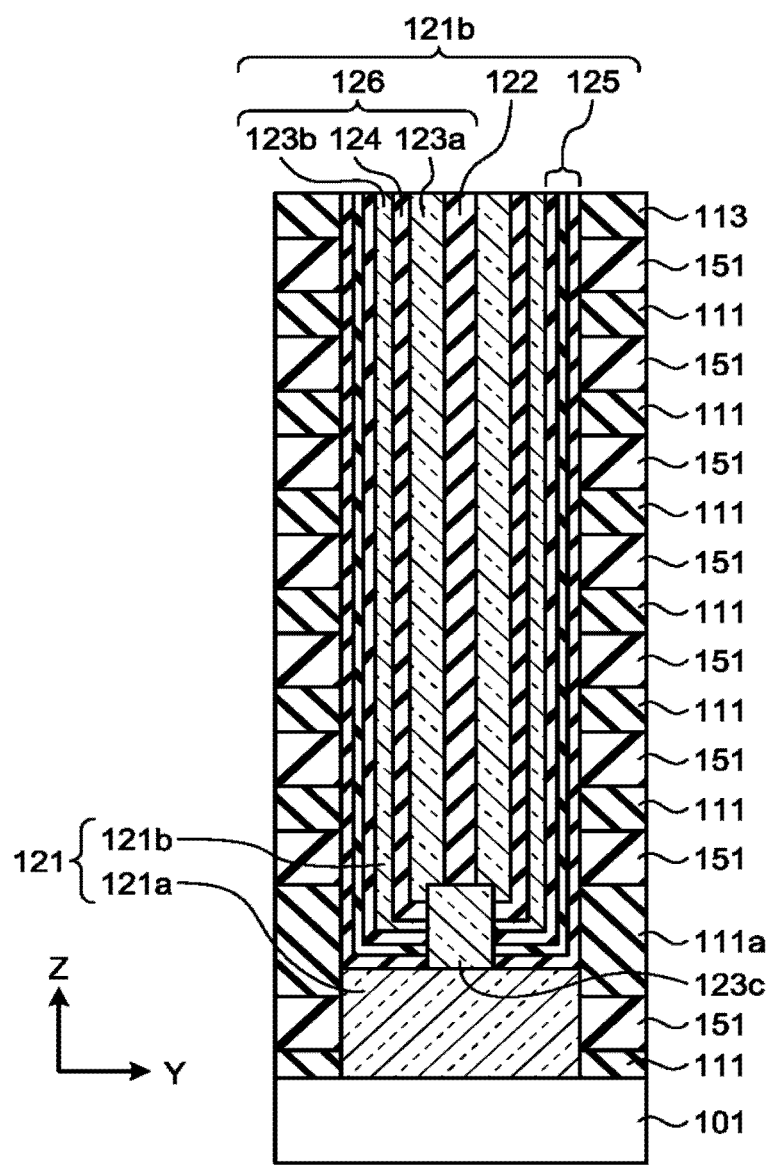

Thereafter, as illustrated in FIG. 4H, a core insulating layer 122 is embedded into each memory hole 120 including the film stack formed on the side surface, which composed of the multi-layer film 125 and the channel layer 126 (the outer channel semiconductor layer 123b, the interlayer film 124, and the inner channel semiconductor layer 123a). As the core insulating layer 122, for example, a silicon oxide film is used. Thereafter, the portions of the core insulating layer 122 and inner channel semiconductor layer 123a on the insulating film 113 are removed by using an RIE method or CMP (Chemical Mechanical Polishing) method. Consequently, an upper pillar member 121b is formed on the lower pillar member 121a in each memory hole 120. Here, a pillar member 121 is composed of the lower pillar member 121a and the upper pillar member 121b.

Thereafter, a resist (not shown) is applied onto the stacked body including the pillar members 121 formed in the respective memory holes 120, and a resist pattern including openings for forming slits is formed by using a lithography technique and a development technique. The openings for forming slits have shapes extending in the X-direction, and are formed on a region including the memory cell part 11 and the word line contact part 20, at predetermined intervals in the Y-direction. Then, the stacked body is etched to form slits 140 by using anisotropic etching, such as an RIE method, through the resist pattern (not shown) serving as a mask. Each slit 140 reaches down to the semiconductor layer 101.

Figure 4I:
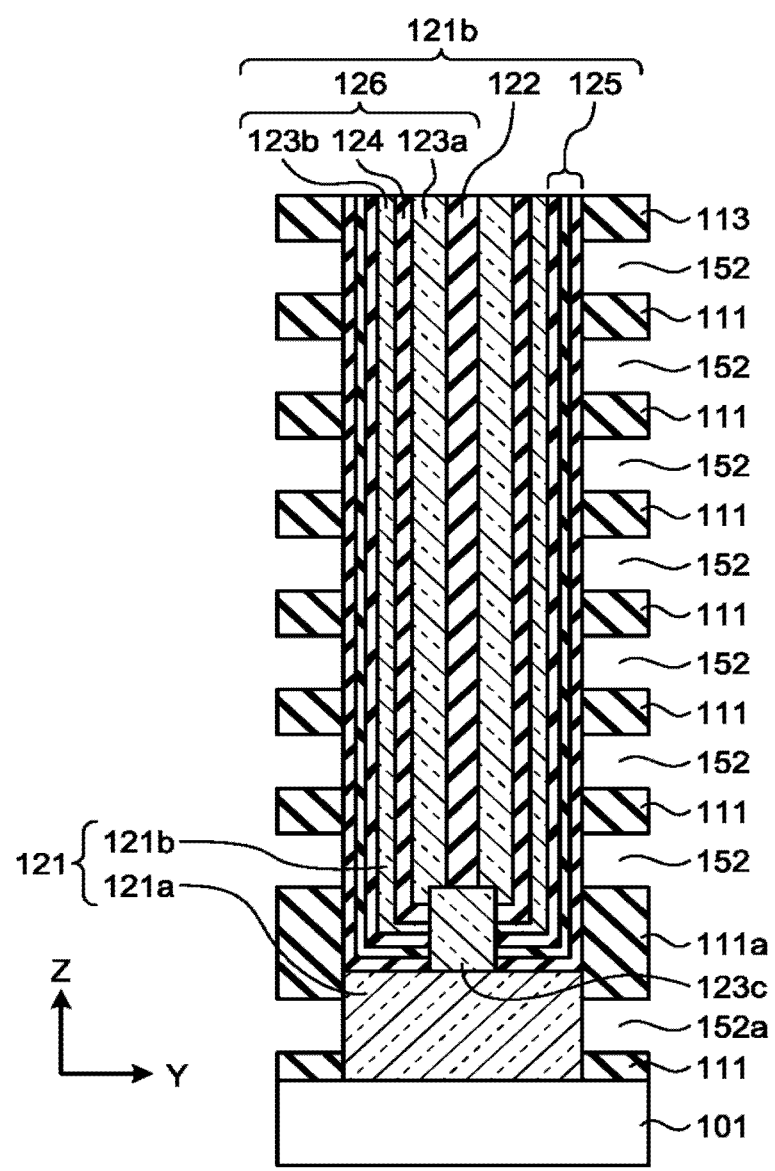

Then, as illustrated in FIG. 4I, the sacrificial films 151 are removed by isotropic etching. For example, the sacrificial films 151 are removed by wet etching using phosphoric acid solution ($H_3PO_4$), or by dry etching, such as CDE (Chemical Dry Etching). Specifically, the etchant comes in through the slits 140 formed as described above, and etches the sacrificial films 151 above the semiconductor layer 101 through the slits 140. Consequently, gaps 152 are formed between the insulating film 113 and the spacer film 111 and between the spacer films 111, and gaps 152a are formed between the spacer film 111 and the spacer film 111a. At this time, the etching is performed under conditions in which the selective ratio of the sacrificial films 151 relative to the spacer films 111 and the insulating film 113 is set to be sufficiently large.

As a result of the above etching, a structure is formed such that the spacer films 111 and 111a and the insulating film 113 are supported by the side surface of each pillar member 121. Here, in the gap 152a at the lowermost lever, the side surface of the lower pillar member 121a is exposed, and, in the other gaps 152, the side surface of the upper pillar member 121b is exposed.

Figure 4J:
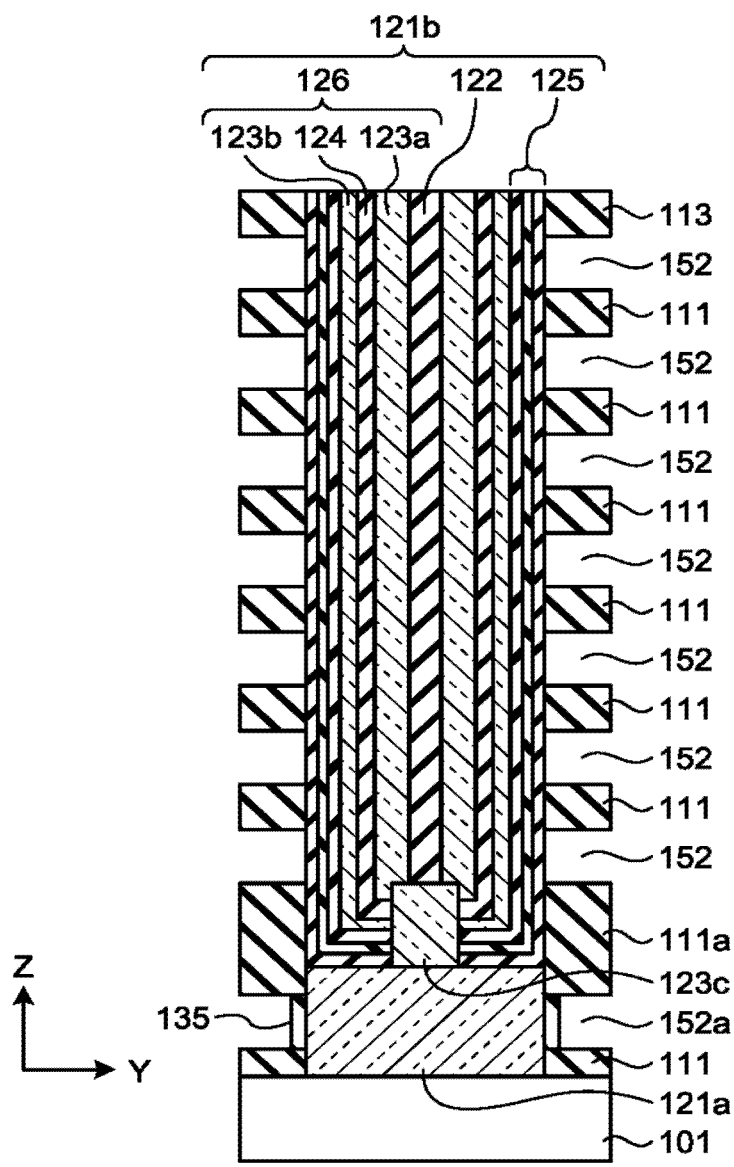

Thereafter, as illustrated in FIG. 4J, a thermal oxidation process is performed to oxidize the side surface of the lower pillar member 121a exposed in the gap 152a at the lowermost layer, whereby an oxide film having a predetermined thickness is formed there. This oxide film is to be used as a gate insulating film 135 in a source-side selection transistor to be formed at the lowermost layer.

Then, an electrode film 112 is embedded into each of the gaps 152 and 152a. As the electrode film 112, for example, tungsten or the like may be used. At this time, it may be adopted that barrier metal film is formed on the side surface and upper and lower surfaces defining each of the gaps 152 and 152a and then the electrode film 112 is embedded. As the barrier metal film, a titanium nitride (TiN) film, tungsten nitride (WN) film, tantalum nitride (TaN) film, or the like map be used. Consequently, the structure illustrated in FIG. 3 is obtained.

Thereafter, the portions of the electrode films 112 deposited on the side surfaces of the insulating film 113 and the spacer films 111 in the slits 140 (not shown) are removed by using anisotropic etching, such as an RIE method. Further, the insulating film 113, the spacer films 111 and 111a, and the electrode films 112 may be etched by using anisotropic etching, such as an RIE method, to make the side surfaces of the slits 140 almost flat.

Then, a dividing portion 141 is formed in each slit 140. Specifically, a spacer film 142 is formed to cover the upper surface of the insulating film 113 and the inner surfaces of the slits 140. As the spacer film 142, for example, an insulating film, such as a silicon oxide film may be used. Thereafter, etching back is performed by using anisotropic etching, such as an RIE method, and the spacer film 142 is thereby left only on the side surfaces of each slit 140. Further, a filling film 143 is embedded into each slit 140. As the filling film 143, a conductive film may be used, or an insulating film may be used. Here, it is assumed that a tungsten film is embedded.

Then, the portion of the filling film 143 on the stacked body is removed by using a CMP method or the like. As a result, the semiconductor memory device illustrated in FIG. 2 is obtained.

Figure 5A:
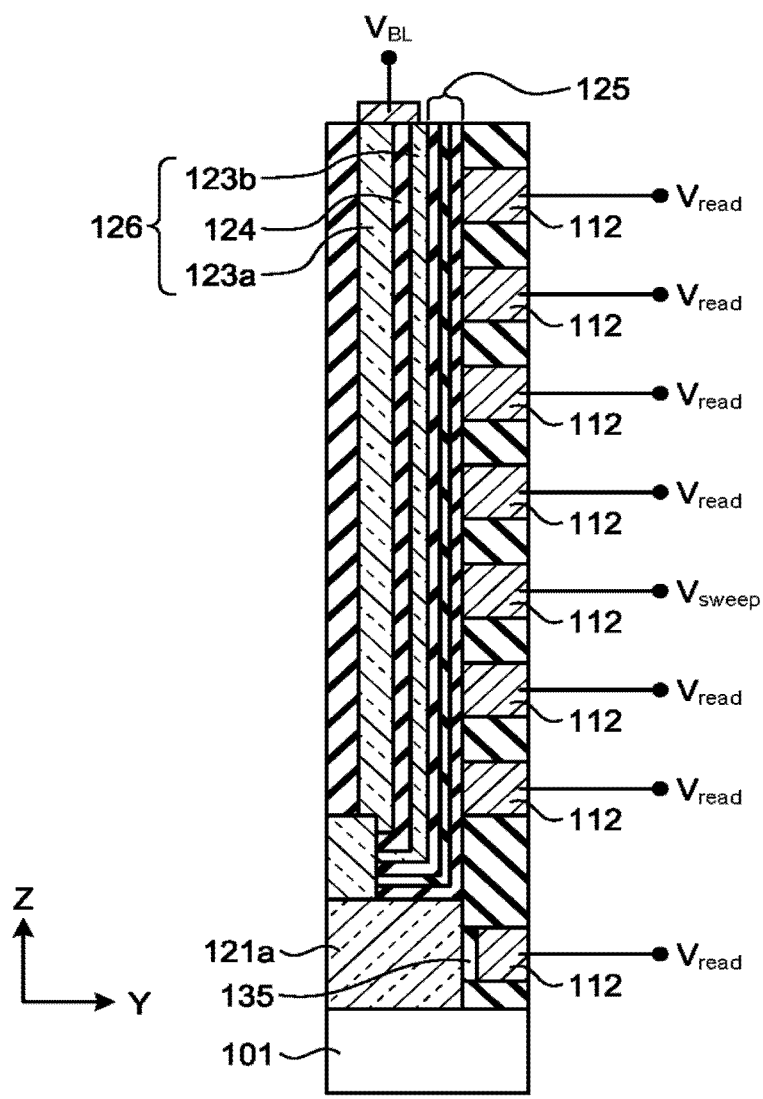
FIGS. 5A and 5B are diagrams each illustrating an example of voltages applied to a memory string in reading of a certain memory cell present in the memory string.
Figure 5B:
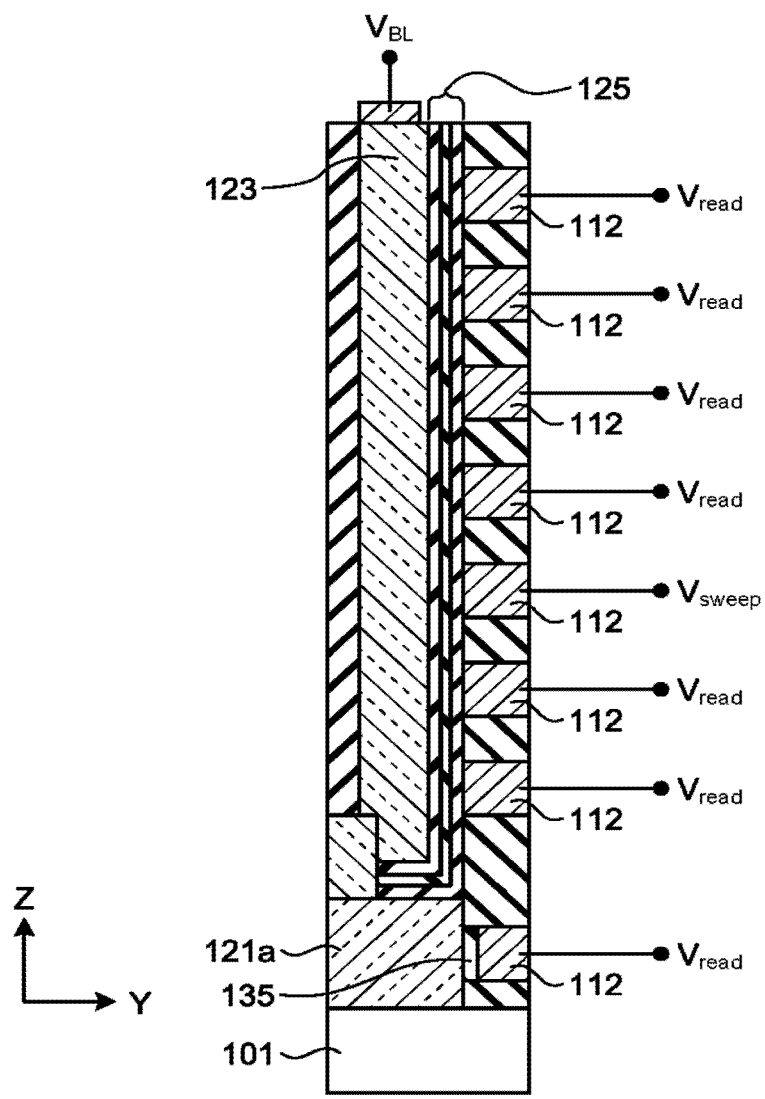
Figure 6:
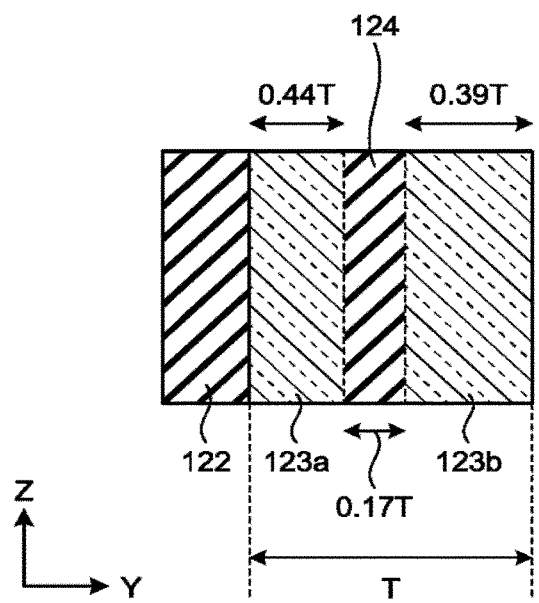
FIG. 6 is a diagram illustrating a configuration example of a channel in the semiconductor memory device according to the first embodiment.

Next, an explanation will be given of an effect of this embodiment in comparison with a comparative example. FIGS. 5A and 5B are diagrams each illustrating an example of voltages applied to a memory string in reading of a certain memory cell present in the memory string. FIG. 5A illustrates the configuration of a memory string in the semiconductor memory device according to the first embodiment. FIG. 5B illustrates the configuration of a memory string in a semiconductor memory device according to a comparative example. FIG. 6 is a diagram illustrating a configuration example of a channel in the semiconductor memory device according to the first embodiment.

In the first embodiment, as described above, the channel layer 126 has a double channel structure composed of the inner channel semiconductor layer 123a and the outer channel semiconductor layer 123b with the interlayer film 124 arranged between these two layers. Further, as illustrated in FIG. 6, where the film thickness of the channel layer 126 is denoted by T, the film thickness of the inner channel semiconductor layer 123a is set to 0.44 T, the film thickness of the interlayer film 124 is set to 0.17 T, and the film thickness of the outer channel semiconductor layer 123b is set to 0.39 T.

On the other hand, in the comparative example, as illustrated in FIG. 5B, the channel layer has a single channel structure composed of a single layer of a channel semiconductor layer 123. The channel semiconductor layer 123 is made of, for example, poly-silicon. Here, the comparative example has a structure similar to that explained in the first embodiment, except for the channel semiconductor layer 123.

Further, here, in reading of a certain memory cell present in the memory string, a current (the ON current of the memory cell) flowing through the bit line is measured, while the voltage applied to the reading target memory cell is varied. A predetermined voltage $V_{BL}$ is applied to the bit line, and a predetermined reading voltage $V_{read}$ is applied to the electrode films 112 of the memory cells other than the reading target and to the electrode films 112 of the selection transistors. Further, a sweep voltage $V_{sweep}$ applied to the electrode film 112 of the reading target memory cell varied, and a current $I_{BL}$ flowing through the bit line is detected. Here, $V_{BL}$ is set to 0.5[V], $V_{read}$ is set to 6.9[V], and $V_{sweep}$ is varied from −2[V] to 6[V], in the detection of the current $I_{BL}$ flowing through the bit line.

Figure 7:
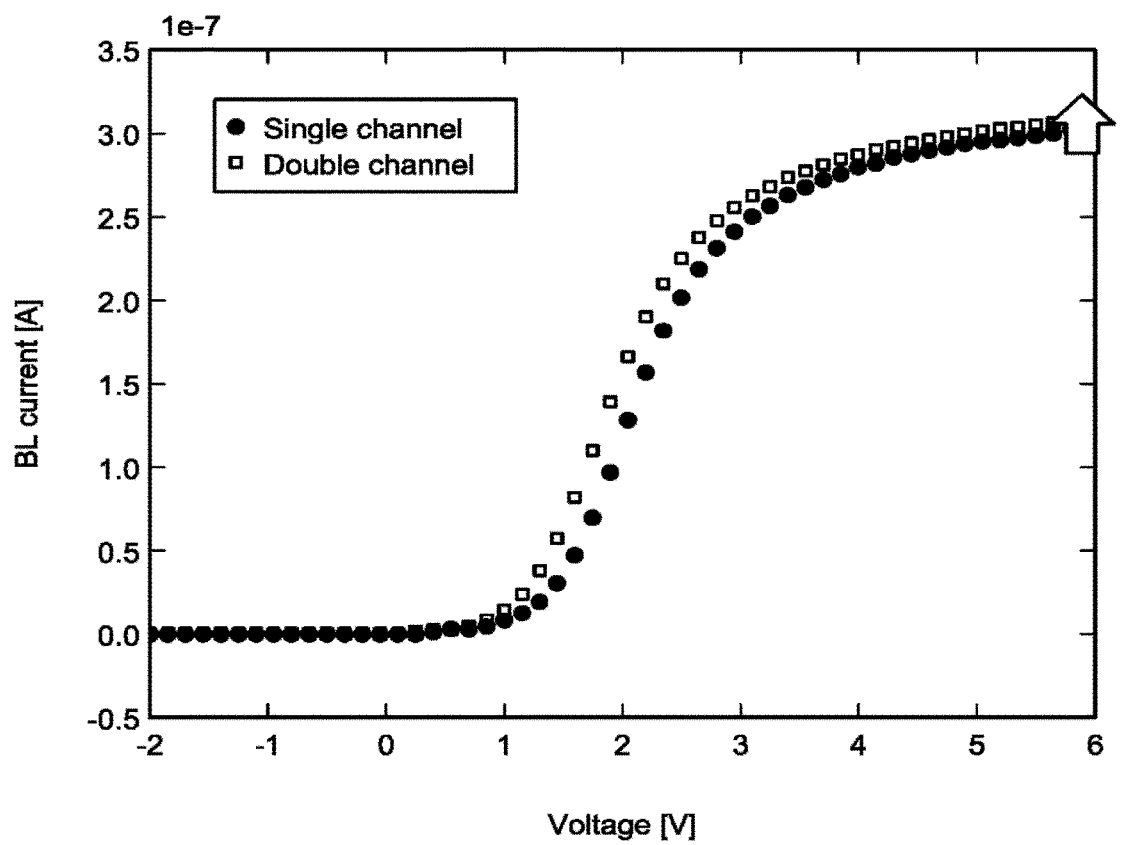
FIG. 7 is a diagram illustrating the relationship between a voltage applied to a reading target memory cell of a memory string and a current flowing through a bit line.

FIG. 7 is a diagram illustrating the relationship between the voltage applied to the reading target memory cell of the memory string and the current flowing through the bit line. In FIG. 7, the horizontal axis shows the voltage $V_{sweep}$ applied to the reading target memory cell, and the vertical axis shows the current $I_{BL}$ flowing through the bit line, i.e., the ON current of the memory cell. As illustrated in FIG. 7, as compared with the semiconductor memory device having the single channel structure according to the comparative example, the ON current of the memory cell is increased in the semiconductor memory device having the double channel structure according to this embodiment.

According to the first embodiment, in the semiconductor memory device having a structure in which memory cells are stacked in the Z-direction, the channel layer 126 is formed in a double channel structure composed of the inner channel semiconductor layer 123a and the outer channel semiconductor layer 123b that sandwich therebetween the interlayer film 124 made of an insulating material. Consequently, in reading of a memory cell, the ON current of the memory cell can be increased, as compared with a case using a single channel structure. As a result, it is possible to increase the number of stacked layers of memory cells in the Z-direction.

Second Embodiment

In the second embodiment, an explanation will be given of a case where the thickness of the outer channel semiconductor layer is varied, while the entire thickness of the channel is set to a predetermined thickness.

Figure 8:
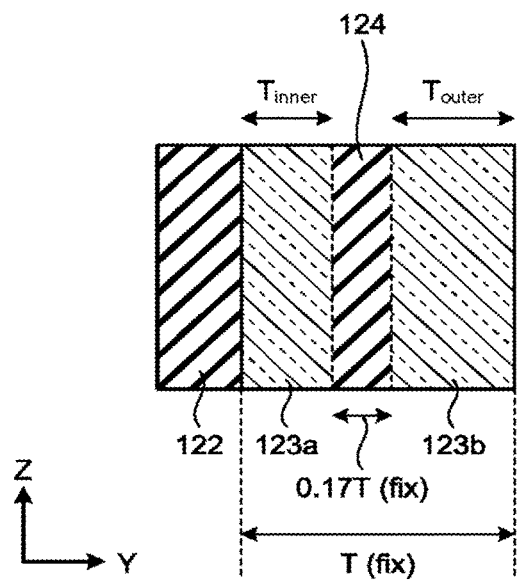
FIG. 8 is a sectional view illustrating an example of the film thickness of a channel portion in a semiconductor memory device according to a second embodiment.

The configuration of a semiconductor memory device according to the second embodiment is similar to that described in the first embodiment. However, the film thicknesses of the inner channel semiconductor layer 123a and the outer channel semiconductor layer 123b are varied. FIG. 8 is a sectional view illustrating an example of the film thickness of a channel portion in the semiconductor memory device according to the second embodiment. As illustrated in FIG. 8, where the film thickness of the channel layer 126 is denoted by T, the film thickness of the interlayer film 124 is set to 0.17 T, and, while these film thicknesses are fixed, the film thickness $T_{inner}$ of the inner channel semiconductor layer 123a and the film thickness $T_{outer}$ of the outer channel semiconductor layer 123b are varied. Here, FIG. 8 illustrates a case where the channel layer 126 is not doped with an impurity.

Further, here, in reading of a certain memory cell present in the memory string, a current (the ON current of the memory cell) flowing through the bit line is measured, while the voltage applied to the reading target memory cell is varied. A predetermined voltage $V_{BL}$ is applied to the bit line, and a predetermined reading voltage $V_{read}$ is applied to the electrode films 112 of the memory cells other than the reading target and to the electrode films 112 of the selection transistors. Further, a sweep voltage $V_{sweep}$ applied to the electrode film 112 of the reading target memory cell is varied, and a current $I_{BL}$ flowing through the bit line is detected. Here, $V_{BL}$ is set to 0.5[V], $V_{read}$ is set to 6.9[V], and $V_{sweep}$ is varied from −2[V] to 6[V], in the detection of the current $I_{BL}$ flowing through the bit line.

Figure 9:
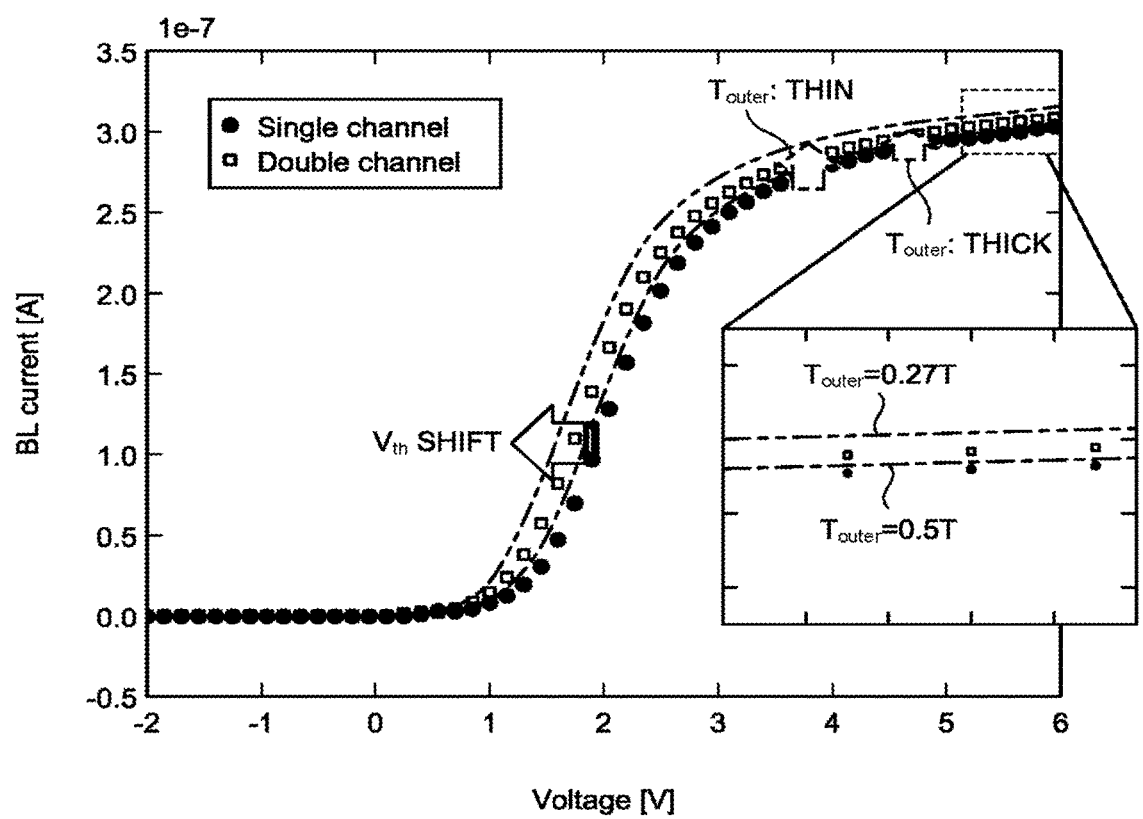
FIG. 9 is a diagram illustrating the relationship between a voltage applied to a reading target memory cell of a memory string and a current flowing through a bit line.

FIG. 9 is a diagram illustrating the relationship between the voltage applied to the reading target memory cell of the memory string and the current flowing through the bit line. In FIG. 9, the horizontal axis shows the voltage $V_{sweep}$ applied to the reading target memory cell, and the vertical axis shows the current $I_{BL}$ flowing through the bit line, i.e., the ON current of the memory cell. Further, FIG. 9 also illustrates the results of FIG. 7 in a superimposed state.

When the film thickness $T_{outer}$ of the outer channel semiconductor layer 123b is set to 0.5 T, the ON current of the memory cell can be increased, as compared with the semiconductor memory device having the single channel structure according to the comparative example. Further, when the film thickness $T_{outer}$ of the outer channel semiconductor layer 123b is set to 0.27 T, the ON current of the memory cell is increased by 4.2%, as compared with the device having the single channel structure. In this way, as the channel layer 126 is formed in a double structure composed of the inner channel semiconductor layer 123a and the outer channel semiconductor layer 123b separated by the interlayer film 124, the ON current of the memory cell can be controlled. Further, in order to increase the ON current of the memory cell, the film thickness $T_{outer}$ of the outer channel semiconductor layer 123b is preferably set as thin as 0.5 T or smaller. Here, in this embodiment, because the channel layer 126 is formed in the double layer structure, the film thickness $T_{outer}$ of the outer channel semiconductor layer 123b taker a value larger than zero.

According to the second embodiment, in the double channel structure, the film thickness $T_{outer}$, of the outer channel semiconductor layer 123b is set to 0.5 T or smaller. Consequently, it is possible to increase, in reading of a memory cell, the ON current of the memory cell, as compared with a case using a single channel structure.

Third Embodiment

In the third embodiment, an explanation will be given of a case where the inner channel semiconductor layer is doped with an impurity.

The configuration of a semiconductor memory device according to the third embodiment is similar t that described in the first embodiment. However, the inner channel semiconductor layer 123a is doped with an N-type impurity, such as arsenic (As) or phosphorous (P). For example, the N-type impurity has a concentration of $1 \times 10^{18}$ cm$^{-3}$, in doping of the inner channel semiconductor layer 123a.

Further, here, where the entire film thickness of the channel is denoted by T, the film thickness of the interlayer film 124 is set to 0.17 T, as illustrated in the second embodiment, and, further, the film thickness of the outer channel semiconductor layer 123b is set to 0.27 T, and the film thickness of the inner channel semiconductor layer 123a is set to 0.56 T. An explanation will be given of a case using such conditions.

Further, in reading of a certain memory cell present in the memory string, a current (the ON current of the memory cell) flowing through the bit line is measured, while the voltage applied to the reading target memory cell is varied. A predetermined voltage $V_{BL}$ is applied to the bit line, and a predetermined reading voltage $V_{read}$ is applied to the electrode films 112 of the memory cells other than the reading target and to the electrode films 112 of the selection transistors. Further, a sweep voltage $V_{sweep}$ applied to the electrode film 112 of the reading target memory cell is varied, and a current $I_{BL}$ flowing through the bit line is detected. Here, $V_{BL}$ is set to 0.5[V], $V_{read}$ is set to 6.9[V], and $V_{sweep}$ is varied from −2[V] to 6[V], in the detection of the current $I_{BL}$ flowing through the bit line.

Figure 10:
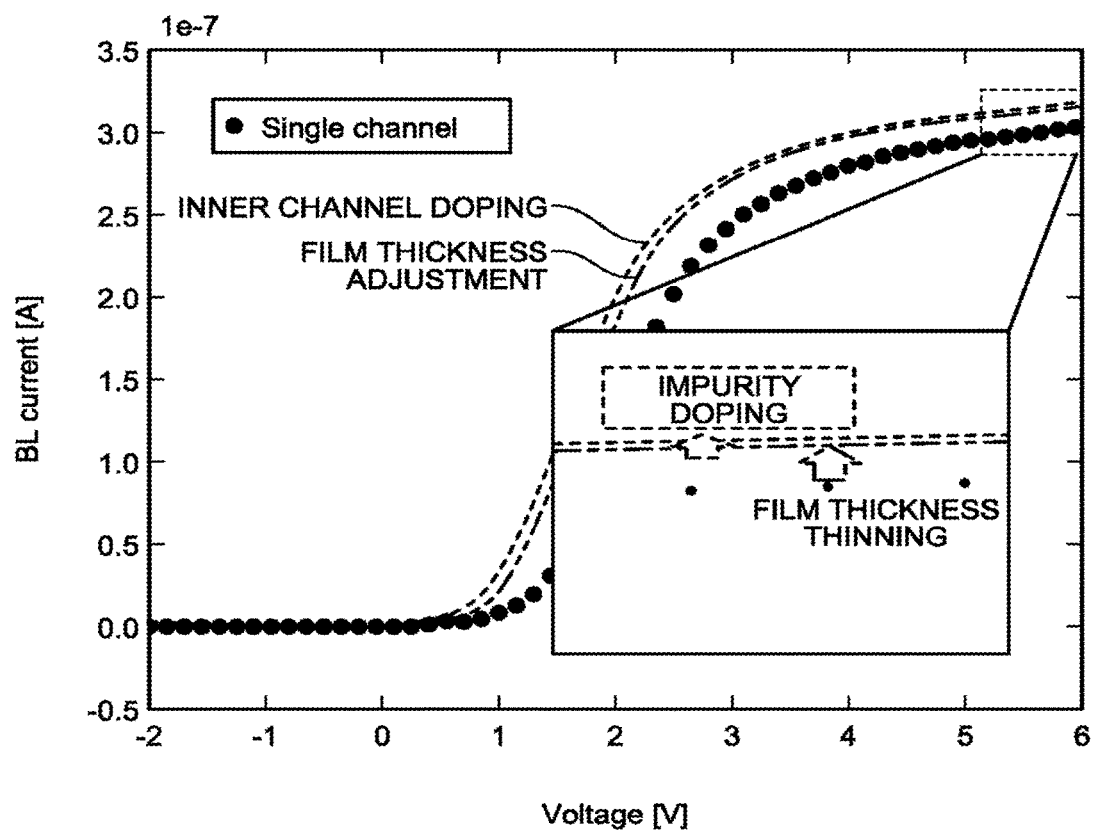
FIG. 10 is a diagram illustrating the relationship between a voltage applied to a reading target memory cell of a memory string and a current flowing through a bit line.

FIG. 10 is a diagram illustrating the relationship between the voltage applied to the reading target memory cell of the memory string and the current flowing through the bit line. In FIG. 10, the horizontal axis shows the voltage $V_{sweep}$ applied to the reading target memory cell, and the vertical axis shows the current $I_{BL}$ flowing through the bit line, i.e., the ON current of the memory cell. Further, FIG. 10 also illustrates, in a superimposed state, the result of FIG. 7 obtained by the comparative example and the result of FIG. 9 obtained by the case where the film thickness $T_{outer}$ of the outer channel semiconductor layer 123b is 0.27 T.

As illustrated in FIG. 10, it is understandable that, by doping the inner channel semiconductor layer 123a with an N-type impurity, the ON current of the memory cell is increased. In this example, the ON current of the memory cell is increased by 0.7%, as compared with the case where the film thickness of the outer channel semiconductor layer 123b is 0.27 T according to the second embodiment. However, the degree of the current increase obtained by doping the inner channel semiconductor layer 123a with an N-type impurity is very small. It is thought that this is because the outer channel semiconductor layer 123b not doped with the N-type impurity has a large component contributing to the current. In other words, it is thought that this is because the current flowing through the channel is in a state where the carrier concentration of an inversion layer of the outer channel semiconductor layer 123b is dominant. Accordingly, the inner channel semiconductor layer 123a is preferably doped in a degree ($1 \times 10^{18}$ cm$^{-3}$ or less) not exceeding the inversion layer concentration of the outer channel semiconductor layer 123b.

According to the third embodiment, the inner channel semiconductor layer 123a is doped with an impurity. As a result, it is possible to increase, in reading of a memory cell, the ON current of the memory cell.

Fourth Embodiment

In the fourth embodiment, an explanation will be given of a case where the material forming the interlayer film is varied.

The configuration of a semiconductor memory device according to the fourth embodiment is similar to that described in the first embodiment. However, the interlayer film 124 is made of a material (Low-k material) having a relative dielectric constant lower than that of a silicon oxide film. As such a material, air, which has a relative permittivity of 1.0, may be cited.

Here, where the entire film thickness of the channel is denoted by T, the film thickness of the interlayer film 124 is set to 0.17 T, as illustrated in the second embodiment, and, further, the film thickness of the outer channel semiconductor layer 123b is set to 0.27 T, and the film thickness of the inner channel semiconductor layer 123a is set to 0.56 T. Further, as described in the third embodiment, the inner channel semiconductor layer 123a is doped with an N-type impurity, such as arsenic (As) or phosphorous (P), in a concentration of $1 \times 10^{18}$ cm$^{-3}$.

Further, in reading of a certain memory cell present in the memory string, a current (the ON current of the memory cell) flowing through the bit line is measured, while the voltage applied to the reading target memory cell is varied. A predetermined voltage $V_{BL}$ is applied to the bit line, and a predetermined reading voltage $V_{read}$ is applied to the electrode films 112 of the memory cells other than the reading target and to the electrode films 112 of the selection transistors. Further, a sweep voltage $V_{sweep}$ applied to the electrode film 112 of the reading target memory cell is varied, and a current $I_{BL}$ flowing through the bit line is detected. Here, $V_{BL}$ is set to 0.5[V], $V_{read}$ is set to 6.9[V], and $V_{sweep}$ is varied from −2[V] to 6[V], in the detection of the current $I_{BL}$ flowing through the bit line.

Figure 11:
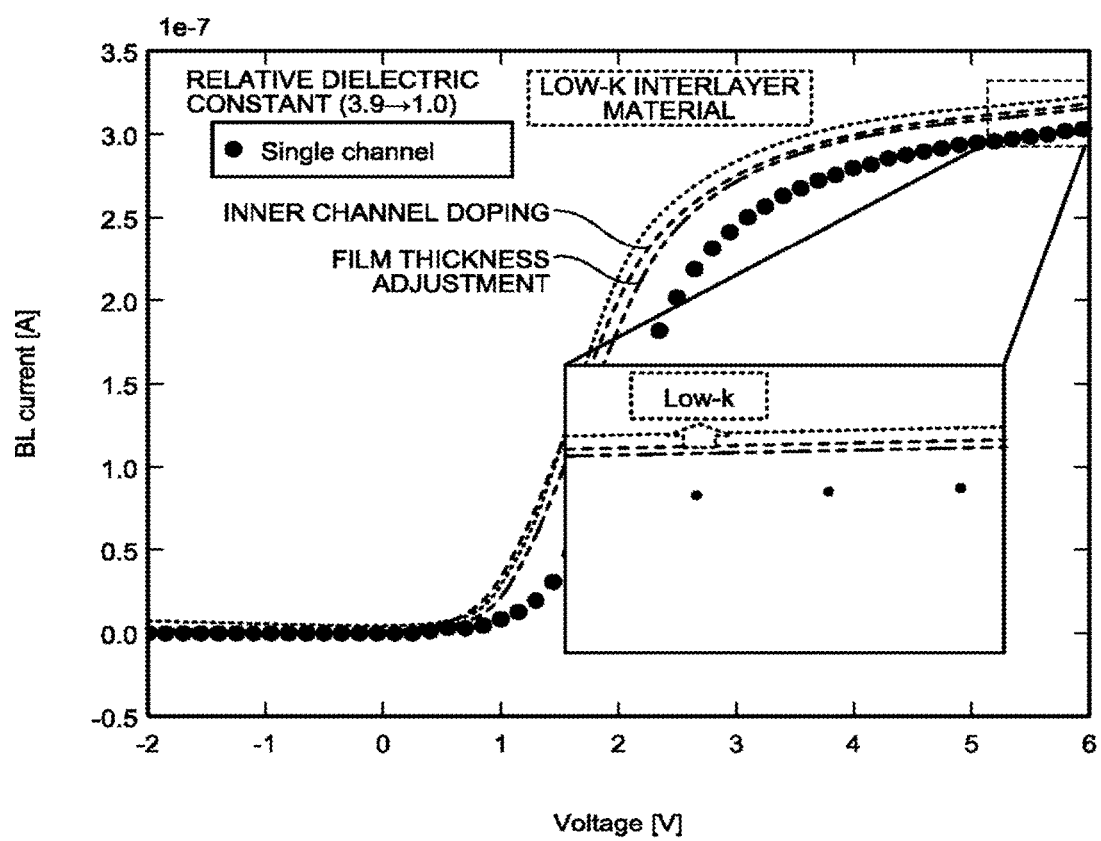
FIG. 11 is a diagram illustrating the relationship between a voltage applied to a reading target memory cell of a memory string and a current flowing through a bit line.

FIG. 11 is a diagram illustrating the relationship between the voltage applied to the reading target memory cell of the memory string and the current flowing through the bit line. In FIG. 11, the horizontal axis shows the voltage $V_{sweep}$ applied to the reading target memory cell, and the vertical axis shows the current $I_{BL}$ flowing through the bit line, i.e., the ON current of the memory cell. Further, FIG. 11 also illustrates, in a superimposed state, the result of FIG. 7 obtained by the comparative example, the result of FIG. 9 obtained by the case where the film thickness $T_{outer}$ of the outer channel semiconductor layer 123b is 0.27 T, and the result of FIG. 10 obtained by the case where the inner channel semiconductor layer 123a is doped with an impurity.

As illustrated in FIG. 11, it is understandable that, by lowering the relative dielectric constant of the interlayer film 124, the ON current of the memory cell is increased. In this example, the ON current of the memory cell is increased by 1.4%, as compared with the case where the inner channel semiconductor layer 123*a* is doped with an impurity. Here, the interlayer film 124 is described as being made of air. However, the ON current of the memory cell can be increased, as long as the interlayer film 124 is made of a material having a relative dielectric constant lower than the relative dielectric constant of an silicon oxide film (3.9 or more). As the material having a relative dielectric constant lower than that of an silicon oxide film, for example, fluorine-containing silicon oxide (SiOF), carbon-containing silicon oxide (SiOC), a polymer material, such as borazine-based polymer, a porous-type material (porous material), such as porous $SiO_2$, or air is cited.

According to the fourth embodiment, the interlayer film 124 is made of a material having a relative dielectric constant lower than that of silicon oxide. Consequently, it is possible to increase, in reading of a memory cell, the ON current of the memory cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a stacked body in which insulating layers and electrode films are alternately stacked;
   a pillar member arranged in a memory hole that is disposed in the stacked body in a thickness direction; and
   a semiconductor layer provided below the pillar member, wherein
   the pillar member has a structure in which a memory film and a channel layer are stacked in order from a side of the stacked body,
   the channel layer has a stacked structure that includes an outer channel semiconductor layer, an intermediate layer made of an insulating material, and an inner channel semiconductor layer, from a side of the memory film, and both of the outer channel semiconductor layer and the inner channel semiconductor layer are electrically connected to the semiconductor layer, and
   the inner channel semiconductor layer is doped with an impurity.

2. The semiconductor memory device according to claim 1, wherein the outer channel semiconductor layer has a thickness larger than zero and equal to or smaller than 0.5T, where T denotes a thickness of the channel layer.

3. The semiconductor memory device according to claim 1, wherein the impurity has a concentration lower than an inversion layer concentration of the outer channel semiconductor layer.

4. The semiconductor memory device according to claim 1, wherein the impurity has a concentration of $1\times10^{18}$ $cm^{-3}$ or less.

5. The semiconductor memory device according to claim 1, wherein the impurity is an N-type impurity.

6. The semiconductor memory device according to claim 5, wherein the N-type impurity is P or As.

7. The semiconductor memory device according to claim 6, wherein the outer channel semiconductor layer is not doped with the N-type impurity.

8. The semiconductor memory device according to claim 1, wherein the intermediate layer is made of an insulating material having a relative dielectric constant lower than 3.9.

9. The semiconductor memory device according to claim 8, wherein the intermediate layer is made of fluorine-containing silicon oxide, carbon-containing silicon oxide, borazine-based polymer, porous $SiO_2$, or air.

10. The semiconductor memory device according to claim 1, wherein the memory film has a structure in which a block insulating film, a charge accumulation film, and a tunnel insulating film are stacked in order from the side of the stacked body.

11. The semiconductor memory device according to claim 10, wherein the pillar member has a structure in which the channel layer, the tunnel insulating film, the charge accumulation film, and the block insulating film are stacked in order on a side surface of a pillar-shaped insulating layer.

12. A semiconductor memory device comprising:
    a stacked body in which insulating layers and electrode films are alternately stacked;
    a pillar member arranged in a memory hole that is disposed in the stacked body in a thickness direction; and
    a semiconductor layer provided below the pillar member, wherein
    the pillar member has a structure in which a memory film and a channel layer are stacked in order from a side of the stacked body,
    the channel layer has a stacked structure that includes an outer channel semiconductor layer, an intermediate layer made of an insulating material, and an inner channel semiconductor layer, from a side of the memory film, and both of the outer channel semiconductor layer and the inner channel semiconductor layer are electrically connected to the semiconductor layer,
    the intermediate layer is made of an insulating material having a relative dielectric constant lower than 3.9, and
    the intermediate layer is made of fluorine-containing silicon oxide, carbon-containing silicon oxide, borazine-based polymer, porous $SiO_2$, or air.

* * * * *